United States Patent
Cheng et al.

(10) Patent No.: US 10,622,454 B2
(45) Date of Patent: Apr. 14, 2020

(54) FORMATION OF A SEMICONDUCTOR DEVICE WITH RIE-FREE SPACERS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/198,921

(22) Filed: Jun. 30, 2016

(65) Prior Publication Data

US 2018/0006030 A1    Jan. 4, 2018

(51) Int. Cl.
*H01L 29/49* (2006.01)
*H01L 29/66* (2006.01)
*H01L 21/8234* (2006.01)
*H01L 29/423* (2006.01)

(52) U.S. Cl.
CPC .. *H01L 29/4966* (2013.01); *H01L 21/823437* (2013.01); *H01L 21/823468* (2013.01); *H01L 29/4236* (2013.01); *H01L 29/6656* (2013.01); *H01L 29/66545* (2013.01); *H01L 29/66795* (2013.01)

(58) Field of Classification Search
CPC .......... H01L 27/0886; H01L 29/66545; H01L 29/6656; H01L 29/4236; H01L 29/4966; H01L 29/66795
See application file for complete search history.

(56) References Cited

U.S. PATENT DOCUMENTS

| | | | |
|---|---|---|---|
| 5,330,935 A | 7/1994 | Dobuzinsky et al. | |
| 7,476,578 B1 | 1/2009 | Cheng et al. | |
| 7,696,036 B2 | 4/2010 | Bu et al. | |
| 8,637,941 B2 | 1/2014 | Li et al. | |
| 2004/0016986 A1* | 1/2004 | Meyer ............... | H01L 21/76205 257/510 |
| 2008/0258234 A1* | 10/2008 | Henson ............. | H01L 21/28097 257/384 |
| 2011/0089479 A1* | 4/2011 | Da .................... | H01L 27/11521 257/324 |
| 2011/0101455 A1 | 5/2011 | Basker et al. | |
| 2011/0198673 A1 | 8/2011 | Bonser et al. | |
| 2014/0084383 A1* | 3/2014 | Cai ................... | H01L 29/66545 257/401 |
| 2014/0103455 A1 | 4/2014 | Ando et al. | |

(Continued)

*Primary Examiner* — Vongsavanh Sengdara
(74) *Attorney, Agent, or Firm* — Cantor Colburn LLP; Vazken Alexanian

(57) ABSTRACT

A method of forming a fin-type field effect transistor (Fin-FET) can comprise forming at least one fin having an active region and a non-active region. Thereafter, a nitride is deposited on the fin. A dummy gate and nitride mask are formed on the fin over the nitride. Oxide spacers are formed on sidewalls of the dummy gate. The nitride is removed from the fin. Thereafter, a source region and a drain region are formed in the active region of the at least one fin. The result is a more reliable finFET without any possible pinch-off problems and fin erosion. Other embodiments are also described herein.

13 Claims, 12 Drawing Sheets

(56) References Cited

U.S. PATENT DOCUMENTS

| | | | | |
|---|---|---|---|---|
| 2014/0239393 A1* | 8/2014 | Kuo | .................... | H01L 29/785 257/347 |
| 2014/0327090 A1* | 11/2014 | Cai | .................. | H01L 29/66545 257/401 |
| 2015/0340302 A1* | 11/2015 | Chen | .................. | H01L 23/3171 257/190 |
| 2016/0086796 A1* | 3/2016 | Chan | .................... | H01L 29/785 257/347 |
| 2016/0163826 A1* | 6/2016 | Cheng | .............. | H01L 29/66636 257/401 |

* cited by examiner

FORMATION OF A SEMICONDUCTOR DEVICE WITH RIE-FREE SPACERS

BACKGROUND

This patent application relates in general to semiconductor device structures and their fabrication. More specifically, the patent application relates to the fabrication of a fin-type field effect transistor (FinFET) with a spacer formed without the use of reactive ion etching.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

One particularly advantageous type of MOSFET is known generally as a fin-type field effect transistor (FinFET). A three-dimensional view of an exemplary FinFET 100 is shown in FIG. 1. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 may be silicon, and STI 104 may be an oxide (e.g., $SiO_2$). Fin 106 may be silicon that has been enriched to a desired concentration level of germanium. Gate 114 controls the source to drain current flow (labeled ELECTRICITY FLOW in FIG. 1). In contrast to a planar MOSFET, however, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor. The formation of a gate spacer might result in erosion of fins, unwanted residual spacer material, and even gate spacer pinch-off.

SUMMARY

Described herein is a method of forming a structure of a semiconductor device. The method includes forming at least one fin having an active region and a non-active region. The method further includes forming a nitride layer on the fin. A dummy gate and nitride mask are formed on the fin over the nitride. Oxide spacers are formed on sidewalls of the dummy gate. The nitride is removed from the fin. Thereafter a source region and a drain region are formed.

Also described herein is a FinFET transistor that includes at least one fin having an active region and a non-active region. The device further includes a channel region in the active region of the at least one fin. The device further includes a source region and a drain region in the active region of the at least one fin. The devise further includes a gate region around the channel region. The gate region controls a flow of current from the source region through the channel region into the drain region. The gate is formed by first depositing a nitride on the fin. Thereafter, a dummy gate and a nitride mask are formed over the nitride and the fin. Oxide spacers are formed on sidewalls of the dummy gate. Nitride is removed from the fin. The dummy gate is removed to form a trench.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

It is understood in advance that although a detailed description of an exemplary FinFET configuration is included, implementation of the teachings recited herein are not limited to the particular FinFET structure described herein. Rather, embodiments of the present invention are capable of being implemented in conjunction with any other type of fin-based transistor device, now known or later developed.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

Described herein is a method of making a semiconductor structure with a new method of forming a gate spacer. As semiconductor feature sizes become smaller, the creation of a gate spacer becomes more difficult. Reactive ion etch (RIE) has typically been used to pull down the spacer on the sidewall of the fin. This can cause unwanted fin erosion. A mask placed on top of the poly Silicon (Si) tends to be wider than the dummy poly gate, resulting from the prolonged dry etch used to form a tall dummy gate. The result can be the presence of unwanted spacer material remaining after spacer RIE. Furthermore, as the device pitch shrinks, the deposition of gate spacer may result in pinch-off between adjacent dummy gates. This is detrimental to the fabrication process and can be an important problem considering pitch walking is present.

Figure 1:
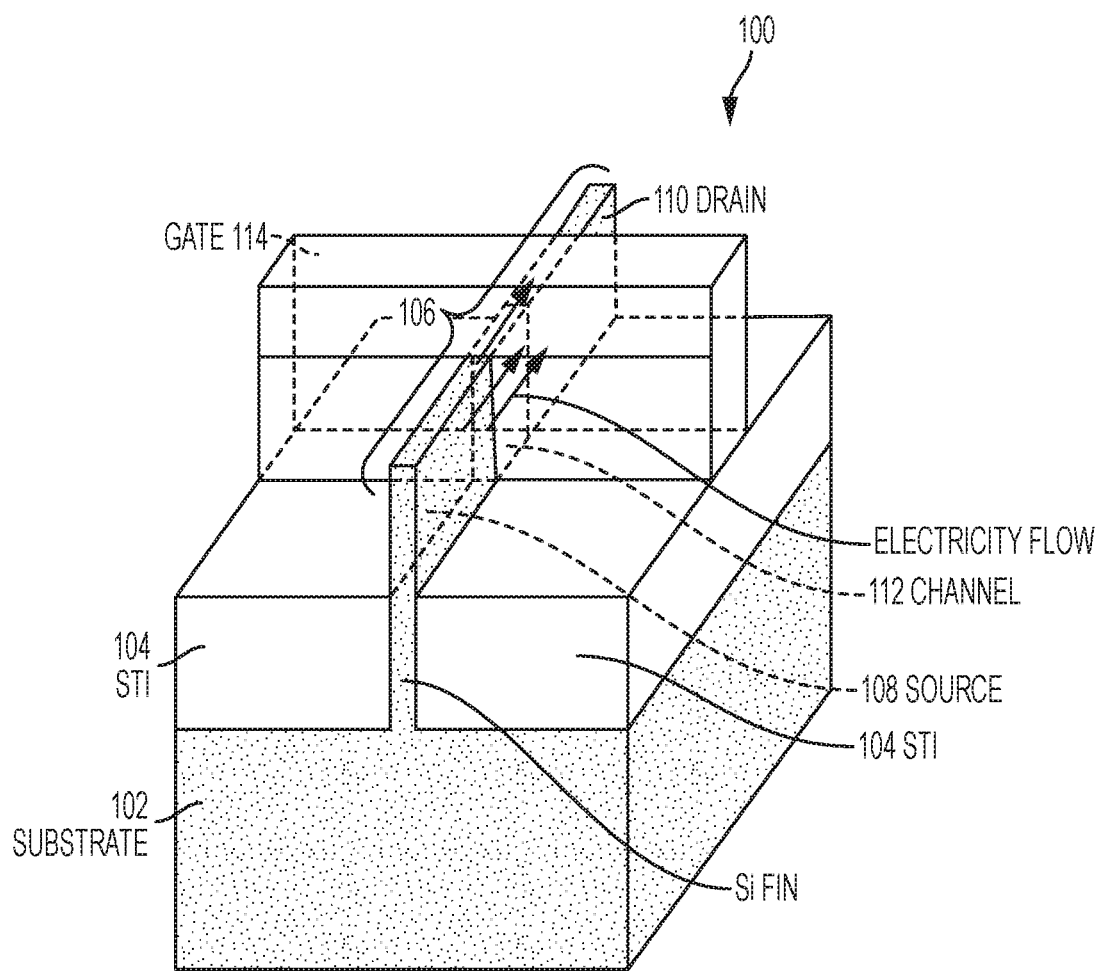
FIG. 1 depicts a three-dimensional view of an exemplary configuration of a known FinFET device.
Figure 2:
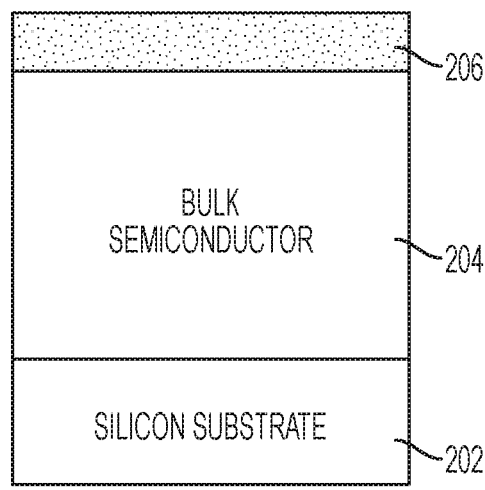
FIG. 2 depicts a semiconductor substrate, a bulk semiconductor material and a hard mask layer.
Figure 3:
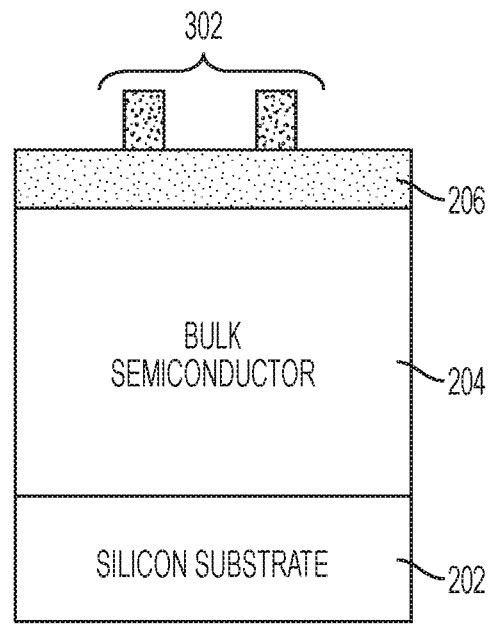
FIG. 3 depicts a patterned resist formed on the structure of FIG. 2.
Figure 4:
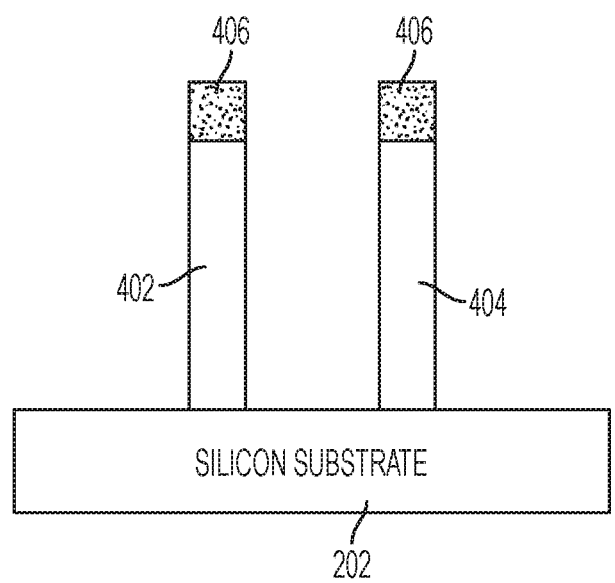
FIG. 4 depicts etching of the resist pattern into the hard mask layer and the bulk semiconductor material.

Turning now to an overview of embodiments of the present invention, one or more embodiments provide a methodology for forming oxide spacers without using RIE. In one or more embodiments, the method involves forming a fin, depositing a nitride on the fin, forming a dummy gate and nitride mask on the fin over the nitride, forming oxide spacers on sidewalls of the dummy gate, and removing nitride over the fin. Such a technique reduces or eliminates problems caused by using RIE techniques as mentioned above Turning now to a more detailed description of an embodiment of the present invention, a preliminary fabrication methodology for forming initial stages of a FinFET semiconductor device in accordance with one or more embodiments will now be described with reference to FIGS. 2-5C. Referring now to FIG. 2, an initial structure is formed having semiconductor substrate 202, a bulk semiconductor material 204 and a hard mask layer 206, configured and arranged as shown. It is noted that bulk semiconductor material 204 and semiconductor substrate 202 may be substantially the same material. Hard mask layer 206 may be a silicon nitride material (e.g., $Si_3Ni_4$). In FIG. 3, a patterned layer 302 is added over hard mask layer 206 to pattern and form fins 402, 404 (shown in FIG. 4) from bulk semiconductor 204. Fins 402, 404 may be formed by applying an anisotropic etch process, which results in the structure shown in FIG. 4. Because there is no stop layer on semiconductor substrate 202, the etch process is time based. Remaining portions 406 of the hard mask layer 206 may then optionally be removed from the fins 402, 404.

Figure 5B:
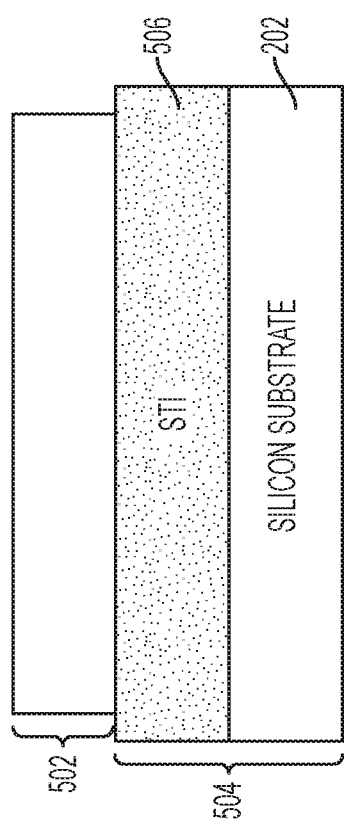
FIG. 5B depicts a cross-sectional view of the semiconductor device shown in FIG. 5A, taken along line 5B-5B.
Figure 5C:
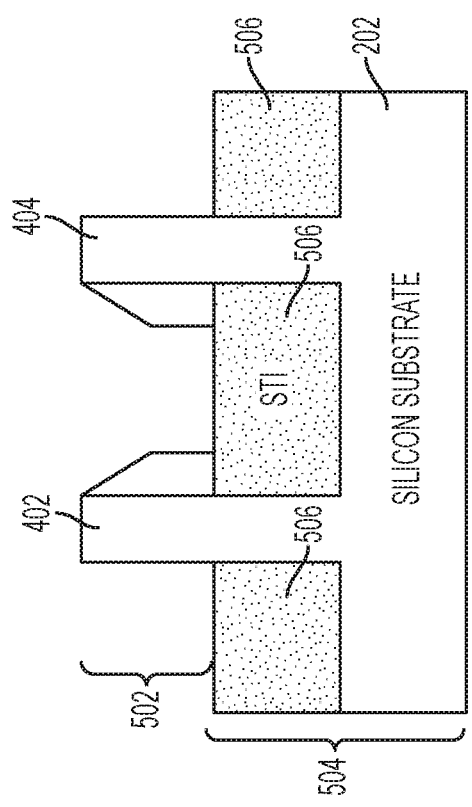
FIG. 5C depicts a cross-sectional view of the semiconductor device shown in FIG. 5A, taken along line 5C-5C.
Figure 5A:
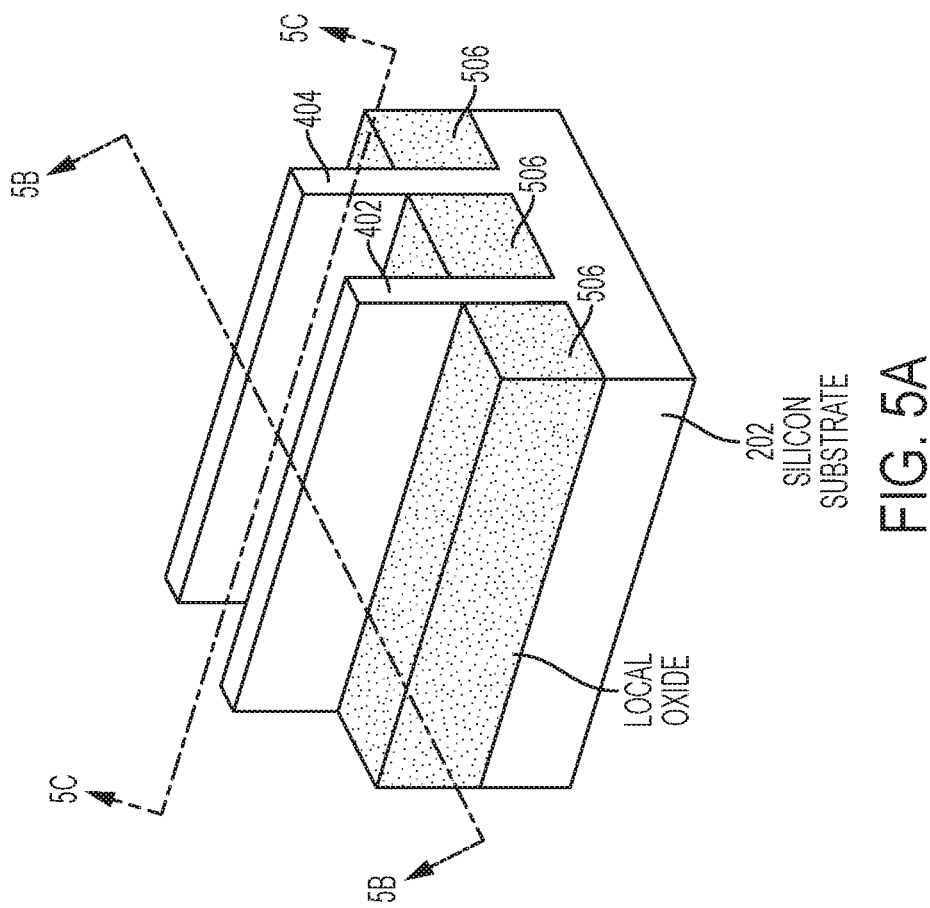
FIG. 5A depicts a three-dimensional view of a semiconductor device after an initial fabrication stage according to one or more embodiments.

In FIGS. 5A, 5B and 5C, a local oxide (e.g., $SiO_2$) is deposited between fins 402, 404 and over substrate 202. The local oxide is polished and recessed back to form STI regions 506, and to expose upper portions 502, 504 of fins 402, 404. FIG. 5A depicts a three-dimensional view of a semiconductor device after an initial fabrication stage according to one or more embodiments. Additionally, FIG. 5B depicts a cross-sectional view of the semiconductor device shown in FIG. 5A, taken along line 5B-5B, and FIG. 5C depicts a cross-sectional view of the semiconductor device shown in FIG. 5A, taken along line 5C-5C. As shown in FIGS. 5A, 5B and 5C, the semiconductor device after this initial stage includes silicon substrate 202, STI regions 506 (approximately 60 nanometers) formed from a local oxide, fins 402, 404, active region 502, and inactive region 504, configured and arranged as shown.

Figure 6:
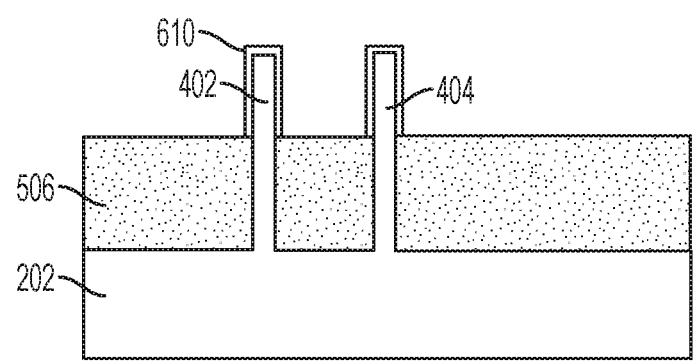
FIG. 6 depicts the structure of FIG. 5 following the formation of fins.

Continuing from the same view as FIG. 5B, FIG. 6 illustrates the process following the formation of fins 402 and 404. After a native oxide clean, a nitride 610, such as $Si_3N_4$, is deposited on fins 402 and 404. Other materials also can be used for nitride 610. In some embodiments, nitride 610 can be formed via a high-temperature nitradation in $NH_3$. In some embodiments, nitride 610 might be approximately 2 nanometers thick.

Figure 7:
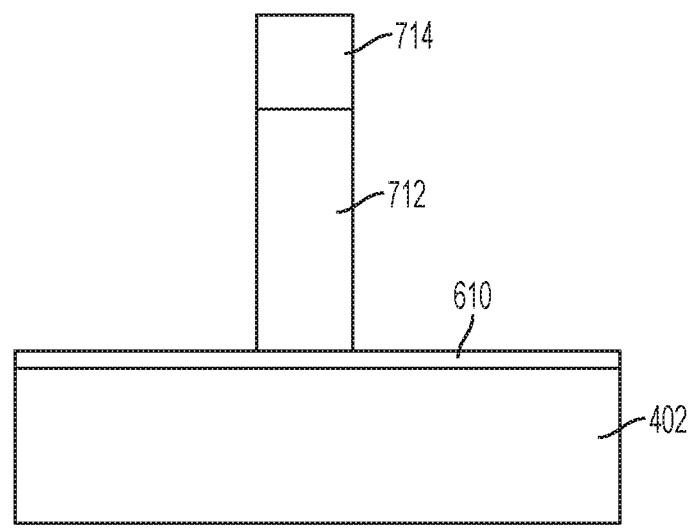
FIG. 7 depicts the formation of a dummy gate.

FIG. 7 is the structure shown in FIG. 6 rotated ninety degrees to form a cross-section along the width of fin 402. It should be understood that a similar construction can occur on fin 404 and any other fin in this assembly. A dummy gate 712 is formed on the nitride. The dummy gate might be formed of an amorphous silicon or a polysilicon. A silicon nitride mask 714 is placed on the dummy gate. A silicon nitride mask 716 is also placed over fin 402.

Figure 8:
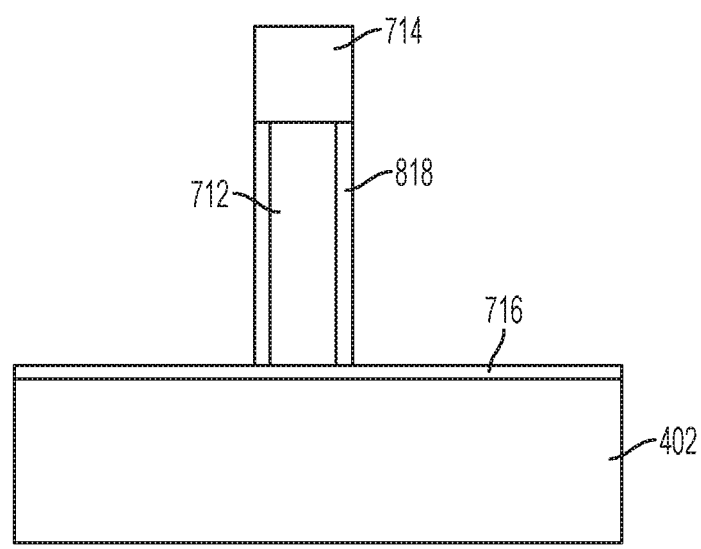
FIG. 8 depicts the formation of oxide spacers.

In FIG. 8, a thermal oxidation step is used to form oxide spacers 818 on the sidewalls of dummy gate 712. No reactive ion etch step is needed. The fins are protected by the nitride 716 ($Si_3N_4$ in some embodiments) during the thermal oxidation process to prevent fin erosion.

Figure 9:
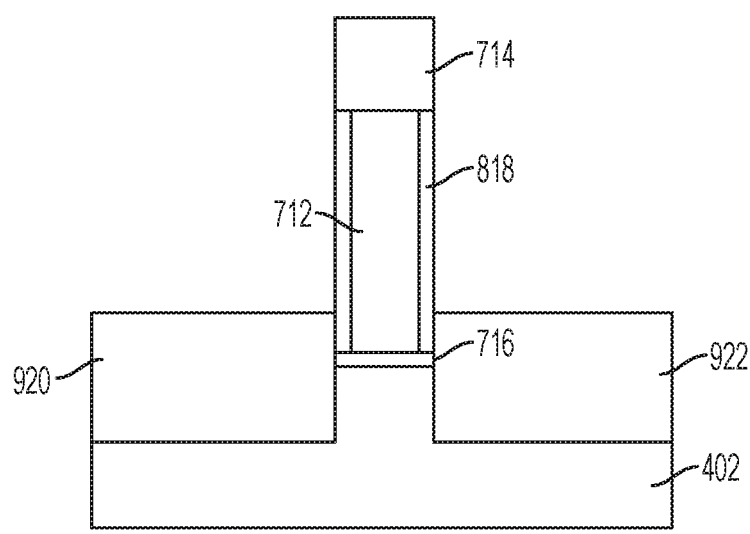
FIG. 9 depicts the removal of nitride and the growth of source and drains.

In FIG. 9, an in-situ removal is performed, removing the nitride 716 that was covering the fin 402. The portion of nitride 716 between fin 202 and dummy gate 712 remains. Thereafter, highly-doped source 920 and drain 922 are epitaxially grown on fin 402.

Figure 10:
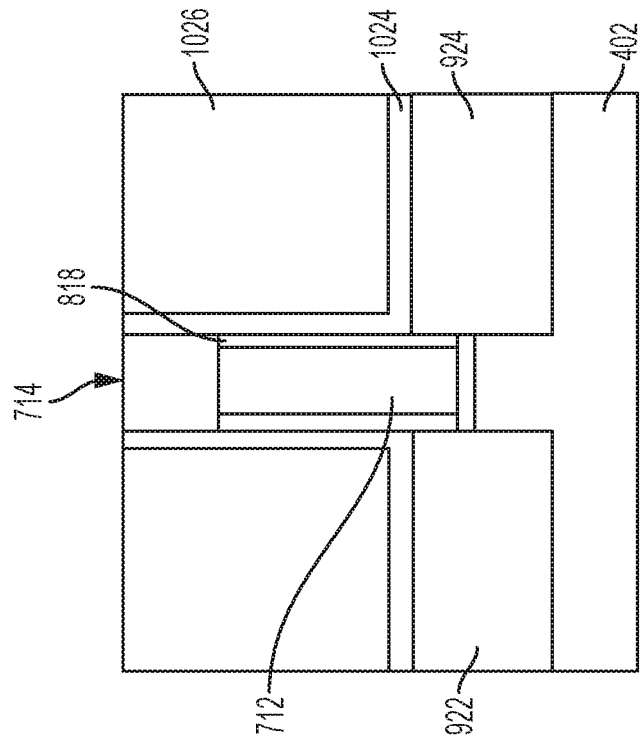
FIG. 10 depicts the result after a liner and dielectric are placed.

In FIG. 10, poly-open chemical mechanical polish (POC) liner 1024 is placed atop the epitaxially grown source 920 and drain 922. This POC liner 1024 can be constructed of silicon nitride. An interlayer dielectric (ILD) 1026 is then deposited on POC liner 1024. ILD 1026 may be constructed of a silicon oxide, such as a flowable oxide.

Figure 11:
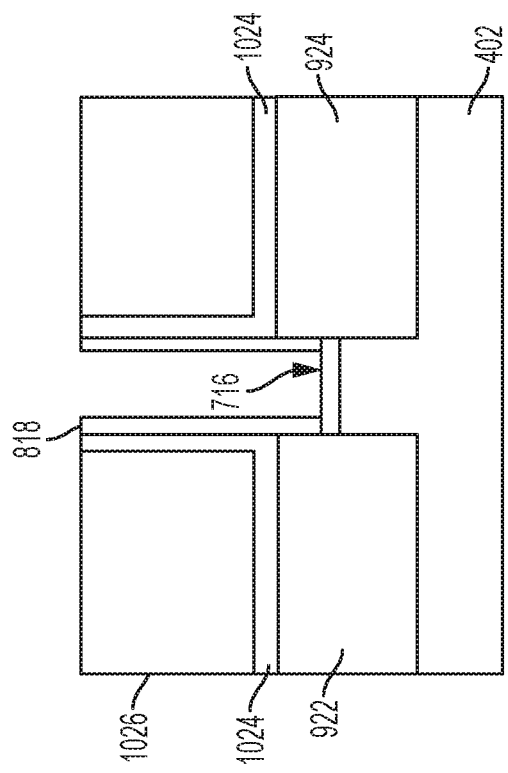
FIG. 11 depicts the removal of the dummy gate.

FIG. 11 illustrates that the silicon nitride mask 714 and the amorphous silicon dummy gate 712 are removed. The removal can take place in one of a variety of different manners, such as via a chemical mechanical polishing (CMP) process, by an etching process, or by chemical oxide removal to form a trench.

Figure 12:
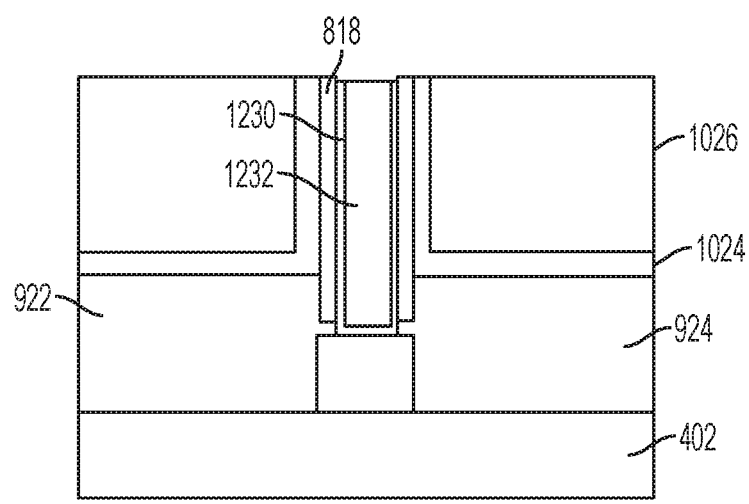
FIG. 12 depicts the removal of the nitride mask and forming of the gate.

In FIG. 12 the in-situ silicon nitride mask 716 is removed from the trench area. Thereafter, the gate is formed. The gate might be one of a variety of different materials. In some embodiments, a dielectric material and gate metal can be deposited in the trench. For example, a high-K dielectric material 1230, such as a hafnium based material can be deposited to form a gate dielectric. A metal liner, e.g., a work-function metal, and a gate metal 1232 can then be deposited on the dielectric material to complete the gate formation. In one or more embodiments, the metal liner can be, for example Titanium Nitride (TiN) or Tantalum Nitride (TaN), and the gate metal can be aluminum or tungsten. Other compositions can also be used.

Figure 13:
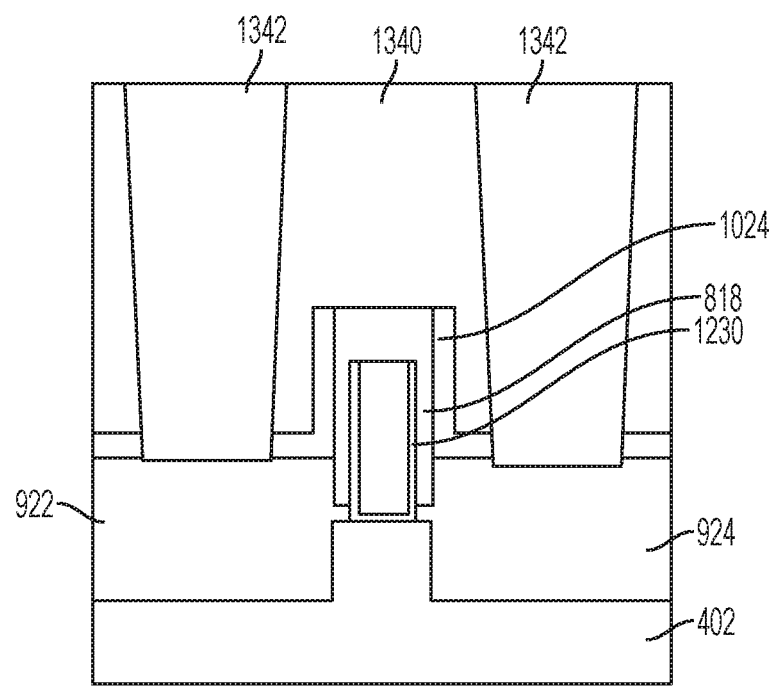
FIG. 13 depicts the result after several conventional processing steps.

In FIG. 13, the formation of the device continues with conventional steps. Conventional processing techniques can include deposition and planarization of a blanket dielectric later, contact formation, and the like so as to complete the semiconductor device. This can be done in a variety of different manners and the result can be one of a variety of different configurations. In the configuration shown in FIG. 13, contacts 1342 have been added along with an interlayer dielectric oxide 1340. Other configurations are possible.

Figure 14A:
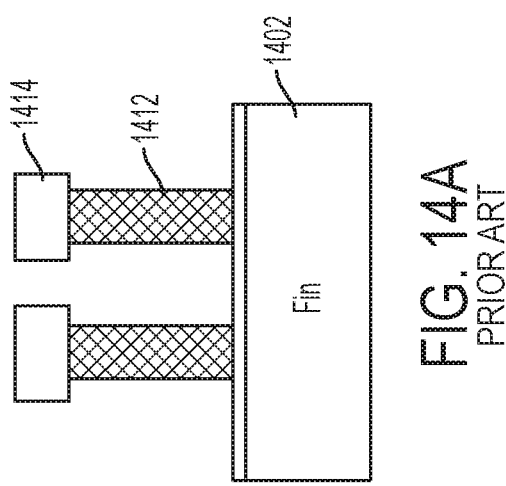
FIG. 14A depicts the formation of a gate in the prior art.
Figure 14B:
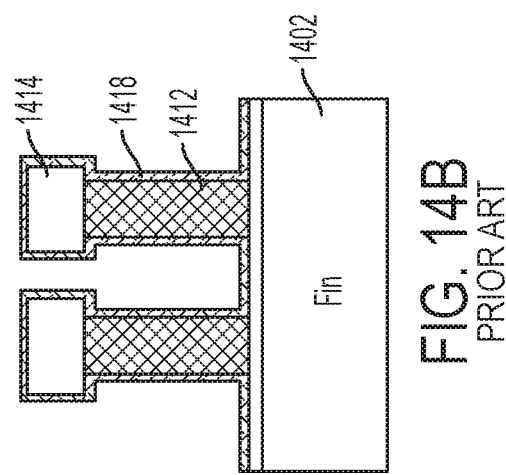
FIG. 14B depicts spacer formation of the prior art.
Figure 14C:
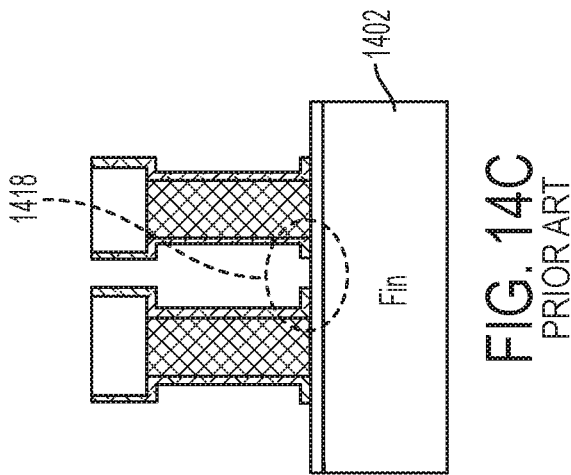
FIG. 14C depicts an etch of the spacer formation of the prior art.

FIGS. 14A-14C illustrate a comparison of prior art methods. FIG. 14A roughly corresponds to FIG. 7, with a fin 1402, a dummy gate 1412, and a mask 1414. As seen in this figure, mask 1414 tends to be wider than the dummy gate. In FIG. 14B, a spacer 1418 of the prior art is applied to the dummy gate 1412 and mask 1414. In FIG. 14C, most of spacer 1418 is removed by a directional RIE. However, there is an unwanted amount of spacer 1418 formed at the bottom of gate 1412. This could lead to the resulting transistor having high external resistance. Embodiments of the present invention avoid such problem through the techniques described herein.

Figure 15:
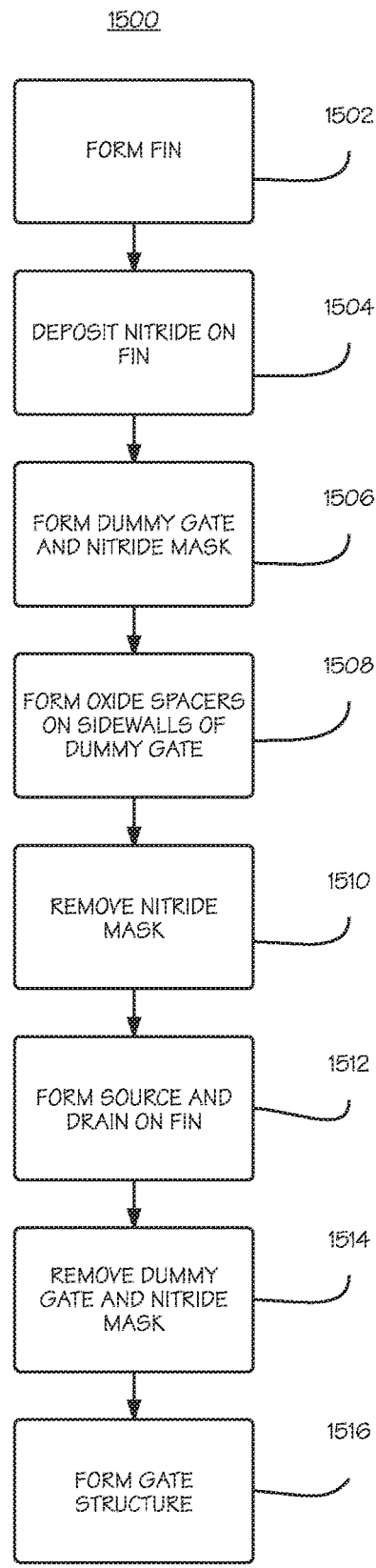
FIG. 15 is a flow diagram illustrating a methodology according to one or more embodiments.

FIG. 15 is a flow diagram illustrating a methodology 1500 according to one or more embodiments. At block 1502, a fin is formed having an active region and a non-active region. At block 1504, a nitride is deposited on the fin. At block 1506, a dummy gate and a nitride mask are added on the fin. At block 1508, oxide spacers are formed on the sidewalls of the dummy gate. At block 1510, the nitride mask is removed. At block 1512, a source and drain are epitaxially grown on the fin. At block 1514, the dummy gate and nitride mask are removed to form a trench. At block 1516, a gate structure is formed in the trench.

Thus, it can be seen from the forgoing detailed description and accompanying illustrations that embodiments of the present invention provide structures and methodologies for providing a spacer that avoids fin erosion and pinch-off problems.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of forming a structure of a semiconductor device, the method comprising:
   forming at least one fin having an active region and a non-active region;
   forming a single first nitride contacting the fin;
   forming a dummy gate on the single first nitride after forming the single first nitride, wherein the dummy gate is in contact with the single first nitride on the fin;
   forming a nitride mask on the dummy gate;
   forming oxide spacers on sidewalls of the dummy gate, wherein the oxide spacers are positioned to not directly contact the at least one fin and the oxide spacers are positioned to directly contact the sidewalls of the dummy gate, wherein a top side of the oxide spacers contacts a bottom side of the nitride mask and the oxide spacers do not extend outside a width of the nitride mask while contacting the sidewalls of the dummy gate; and
   removing the single first nitride and forming a source region and a drain region.

2. The method of claim 1 further comprising removing the dummy gate and nitride mask to form a trench.

3. The method of claim 2 further comprising forming a gate structure in the trench.

4. The method of claim 3 wherein forming the gate structure comprises:
   removing nitride covering the fin in the gate trench;
   depositing a high-K dielectric material in the trench; and
   depositing a metal material on the dielectric material.

5. The method of claim 4 wherein the metal material is chosen from aluminum and tungsten.

6. The method of claim 4 further comprising depositing a metal liner between the high-K dielectric material and the gate metal.

7. The method of claim 1 further comprising performing a native oxide clean prior to forming oxide spacers.

8. The method of claim 1 wherein depositing the single first nitride on the fin comprises performing a nitradation in $NH_3$.

9. The method of claim 1 wherein the dummy gate comprises either an amorphous silicon or a polysilicon.

10. The method of claim 1 wherein forming oxide spacers on sidewalls of the dummy gate comprises performing a thermal oxidation.

11. The method of claim 1 further comprising forming a poly-open chemical mechanical polish (POC) liner atop the source region and drain region.

12. The method of claim 11 further comprising depositing an inter-layer dielectric on the POC liner.

13. The method of claim 12 wherein the inter-layer dielectric comprises a silicon oxide.

* * * * *